(12) United States Patent
Parikh

(10) Patent No.: US 8,493,149 B2
(45) Date of Patent: Jul. 23, 2013

(54) AMPLIFIER CIRCUIT WITH VARIABLE TUNING PRECISION

(75) Inventor: Samir Parikh, Sunnyvale, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/218,080

(22) Filed: Aug. 25, 2011

(65) Prior Publication Data
US 2013/0049868 A1  Feb. 28, 2013

(51) Int. Cl.
*H03F 3/45* (2006.01)
(52) U.S. Cl.
USPC .......................... 330/254; 330/305
(58) Field of Classification Search
USPC ................................. 330/254, 305
See application file for complete search history.

(56) References Cited

U.S. PATENT DOCUMENTS

| | | | | |
|---|---|---|---|---|
| 5,227,681 A | * | 7/1993 | Koyama et al. | 327/65 |
| 5,726,604 A | * | 3/1998 | Onetti et al. | 330/283 |
| 6,570,447 B2 | * | 5/2003 | Cyrusian et al. | 330/254 |
| 6,891,436 B2 | * | 5/2005 | Kim et al. | 330/254 |
| 7,551,029 B2 | * | 6/2009 | Pan | 330/254 |
| 2007/0210870 A1 | * | 9/2007 | Pan | 330/254 |

OTHER PUBLICATIONS

J. Bulzacchelli, et al, "A 10Gb/s 5-Tap DFE/4-Tap FFE Transceiver in 90-nm" CMOS Technology, IEEE JSSC, vol. 41, No. 12, pp. 2885-2900, Dec. 2006.

* cited by examiner

*Primary Examiner* — Khanh V Nguyen
(74) *Attorney, Agent, or Firm* — Baker Botts L.L.P.

(57) ABSTRACT

Systems and methods are provided for facilitating variable precision tuning of an amplifier circuit. In accordance with one aspect of the present disclosure, the system includes an amplifier having multiple tuning stages to set the gain of the amplifier to discrete gain levels. In particular embodiments, the tuning stages are connected in series and each of the tuning stages includes a resistor connected in parallel to a switch, which can be disengaged to cause the amplifier to set the gain to an adjacent gain level. In certain embodiments, the difference in gain between each adjacent one of the plurality of gain levels is more at higher gain levels than at lower gain levels.

23 Claims, 4 Drawing Sheets

AMPLIFIER CIRCUIT WITH VARIABLE TUNING PRECISION

TECHNICAL FIELD

The present application relates generally to amplifiers, and more specifically to amplifiers with variable tuning precision.

BACKGROUND

Amplifiers are used in a variety of applications to amplify signals. Amplifiers can be implemented by various circuits, such as linear equalizer circuits. Amplifier circuits amplify signals to compensate for degradation of the signals across a communication medium. Amplifier circuits can be tuned using appropriate circuitry.

SUMMARY

In accordance with one aspect of the present disclosure a system is provided for facilitating variable tuning of an amplifier circuit. The system includes an amplifier having multiple tuning stages to set the gain of the amplifier to discrete gain levels. In particular embodiments, the tuning stages are connected in series and each tuning stage includes a resistor connected in parallel to a switch, which can be disengaged to cause the amplifier to set the gain to an adjacent gain level. In certain embodiments, the difference in gain between each adjacent one of the plurality of gain levels is more at higher gain levels than at lower gain levels.

In accordance with another aspect of the present disclosure the amplifier includes additional tuning stages to set the gain of the amplifier to additional discrete gain levels. In particular embodiments, the tuning stages are connected in parallel and each of the additional tuning stages includes a resistor connected in series to a switch, which can be engaged to cause the amplifier to set the gain to an adjacent one of the additional gain levels. In certain embodiments, the difference in gain between each adjacent one of the additional plurality of gain levels is less at higher gain levels than at lower gain levels.

Amplifier circuits with variable precision tuning according to the present disclosure have a number of technical advantages. For example, amplifier circuits, such as linear equalizer circuits, may compensate for signal degradation across various communication media and different operational environments. In order to accommodate these changing variables, amplifier circuits with variable precision tuning enable tuning of the gain across the frequency domain using one or more selectable tuning stages. Embodiments of the present disclosure may facilitate adjusting the gain of the amplifier circuit to one of many possible discrete gain levels. In those embodiments, for example, the difference in gain between two adjacent gain levels may be less at higher gain levels than at lower gain levels. Accordingly, the amplifier circuits may accommodate fine tuning at higher magnitudes of gain and coarse tuning at lower magnitudes of gain. In other embodiments, such amplifier circuitry may be combined with additional circuitry to further facilitate coarse tuning at higher magnitudes of gain and fine tuning at higher magnitudes of gain.

BRIEF DESCRIPTION OF THE DRAWINGS

A better understanding of the present disclosure will be realized from the detailed description that follows, taken in conjunction with the accompanying drawings, in which.

DETAILED DESCRIPTION

Figure 1A:
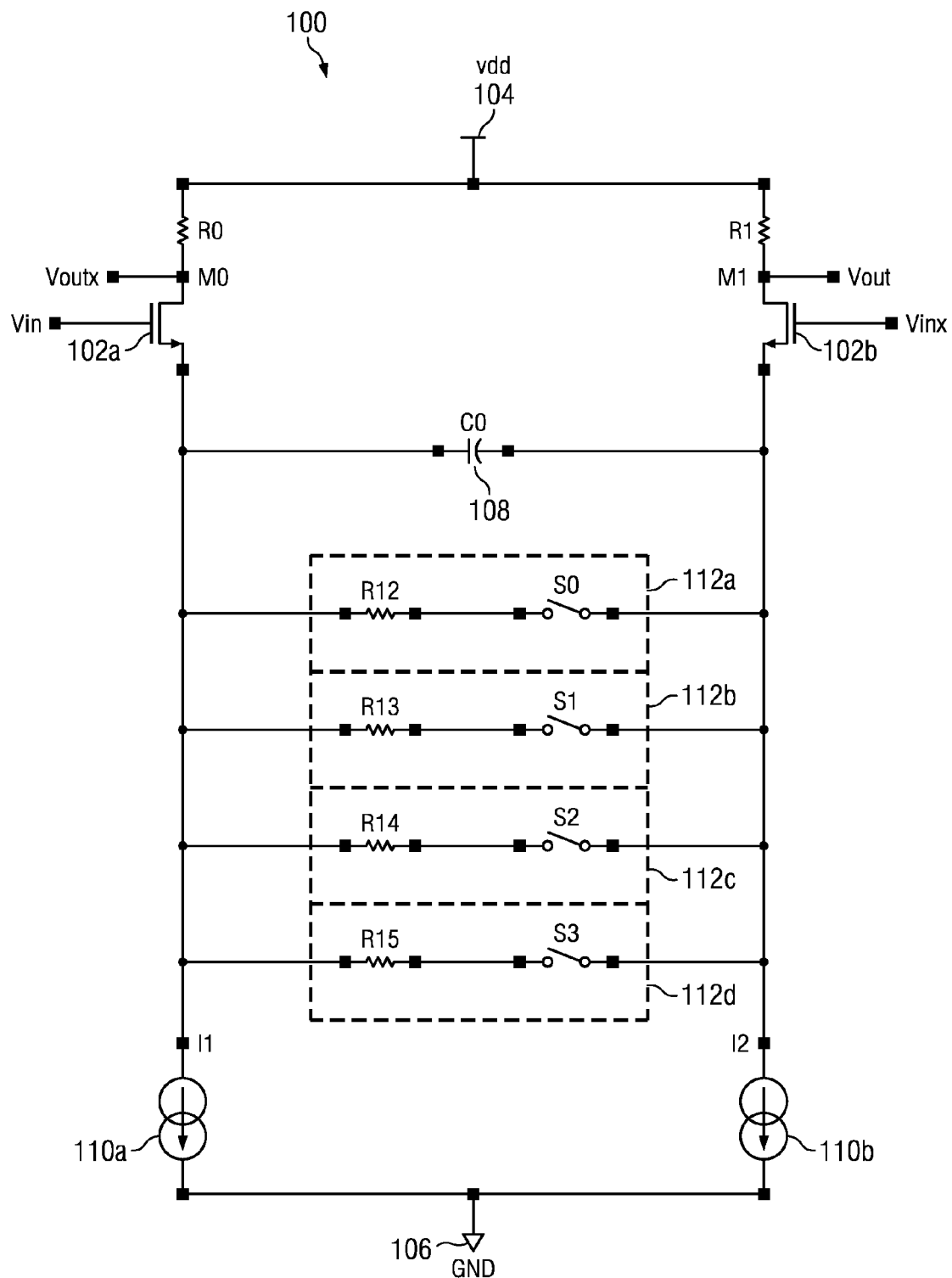
FIG. 1A is a schematic diagram of an amplifier with fine-coarse tuning steps.

FIG. 1A illustrates a schematic diagram of an amplifier circuit 100 for amplification with fine-coarse tuning steps. In particular embodiments, the amplifier circuit 100 may be implemented as a linear equalizer circuit. The elements of amplifier circuit 100 interoperate to amplify a signal by tuning the gain of the amplifier to provide suitable amplification at appropriate operating frequencies. For example, amplifier circuit 100 facilitates adding or subtracting resistive elements to the amplifier circuit using a collection of tuning stages, each tuning stage having a resistor and a switch connected to each other in series and each tuning stage connected in parallel to the other such tuning stages. Variable tuning of the amplifier circuit enables users to set an appropriate gain across the desired operational frequencies and thereby adapt the circuit for use in different environments. For example, an amplifier circuit may be used in a communication system environment that includes two or more transceivers, and a communication medium known to degrade the quality of the signal communicated by one of the transceivers to another. The level of signal degradation across one communication medium may vary from another communication medium depending on various environmental and operational factors. For example, a backplane communication system of a particular datacenter used to facilitate communication between multiple blade servers may differ from the backplane communication system of another datacenter due to the distance between blade servers or certain physical characteristics of the communication system and/or medium. Certain environmental factors may include temperature and pressure. An amplifier circuit with variable tuning enables the use of substantially the same circuit for many different environments by providing tuning mechanisms to set the amplification of the amplifier circuit such that it compensates for the signal degradation experienced in a particular operational environment. Amplifier circuits with variable tuning, such as the one illustrated in amplifier circuit 100, provide users with flexibility to adjust the amplification of the circuit as needed in the field by providing fine tuning at high magnitudes of gain and coarse tuning at low magnitudes of gain.

As illustrated, amplifier circuit 100 includes a pair of metal oxide semiconductor field effect transistor (MOSFET) 102, a voltage source 104, a ground terminal 106, a capacitor 108, current sources 110, and multiple tuning stages 112. As shown, amplifier circuit 100 is operable to receive an input at the gate of the MOSFET 102a and an inversion of the input at the gate of MOSFET 102b, facilitate variable tuning through cascaded tuning stages, and provide an output at the drain of the MOSFET 102b and an inverted output at the drain of MOSFET 102a. The amplification rendered by amplifier circuit 100 can be tuned by actuating the tuning stages 112. Although only a pair of MOSFETS 102 are illustrated, there may be any suitable combination of transistors for providing appropriate amplification. As shown, tuning stages 112a, 112b, 112c, and 112d are electrically connected in parallel. Each tuning stage includes a switch and a corresponding resistor connected in parallel for tuning the amplification of amplifier circuit 100. Actuating the switch of 112a causes the corresponding resistor of tuning stage 112a to adjust the effective resistance collectively provided by the tuning stages 112, thereby tuning the amplification of amplifier circuit 100. In a similar fashion, the switches corresponding to tuning stages 112b-d may be actuated to adjust the level of amplification provided by amplifier circuit 100.

Figure 1B:
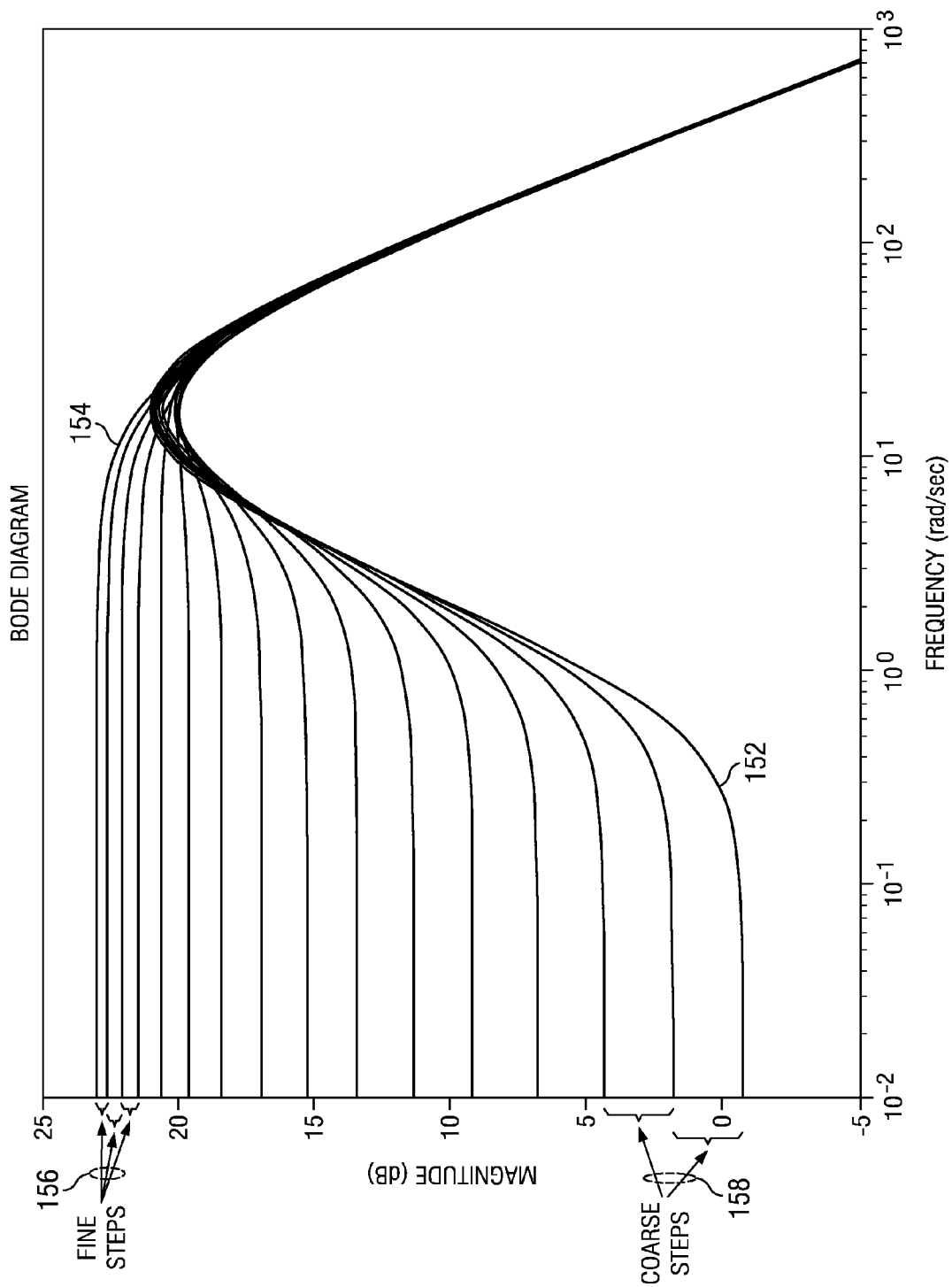
FIG. 1B is a bode diagram of the amplification of the amplifier of FIG. 1A.

FIG. 1B is a bode graph 150 illustrating the amplification of amplifier circuit 100 as tuned by tuning stages 112. As illustrated, the x-axis of bode graph 150 depicts frequency in radians per second on a logarithmic scale. The y-axis depicts the magnitude of the gain of amplifier circuit 100 in decibels. The bode graph 150 shows a particular operating range of amplifier circuit 100 as approximately 5 to 50 radians per second for purposes of illustration. Some embodiments may have an operating range from about 10 MHz to 100 GHz. In certain embodiments, the magnitude may range from −10 dB to +10 dB. The bode graph 150 illustrates the characteristics of the amplifier circuit 100 in various tuning configurations. For example, frequency response 152 corresponds to the state in which all the switches of tuning stages 112 are disengaged (as shown in FIG. 1A) while frequency response 154 corresponds to the state in which all switches of tuning stages 112 are engaged. The frequency responses depicted in between frequency response 152 and frequency response 154 illustrate the result of other possible combinations for tuning the amplification of amplifier circuit 100. In particular embodiments, tuning the gain from one tuning combination to another may involve actuating one or more of the switches corresponding to each of the tuning stages 112. As illustrated, the selection of various possible tuning combinations produces discrete gain levels. Bode graph 150 also illustrates that the tuning of amplifier circuit 100 by tuning stages 112 causes fine tuning steps 156 at higher gain levels and coarse tuning steps 158 at lower gain levels. For example, the difference in gain between two adjacent gain levels may be less at higher magnitudes of gain than at lower magnitudes of gain. In certain embodiments, adjacent gain levels at lower magnitudes of gain may have a difference of greater than about one decibel. In those embodiments, adjacent gain levels at higher magnitudes of gain may have a difference of less than about one decibel. For example, the difference in magnitudes at lower magnitudes of gain may span from about 1 decibels to about 3 decibels as depicted in bode graph 150. Such variations in adjacent gain levels may be achieved by amplifier circuit 100. For example, selecting appropriate values of resistance for the resistor corresponding to each tuning stage 112 along with the parallel configuration of tuning stages 112 renders the various possible frequency responses illustrated in bode graph 150, thereby facilitating fine tuning at higher magnitudes of gain and coarse tuning at lower magnitudes of gain. In other embodiments, selecting other values of resistance for the resistor corresponding to each tuning stage 112 may render tuning steps that are approximately equal in size.

Figure 2A:
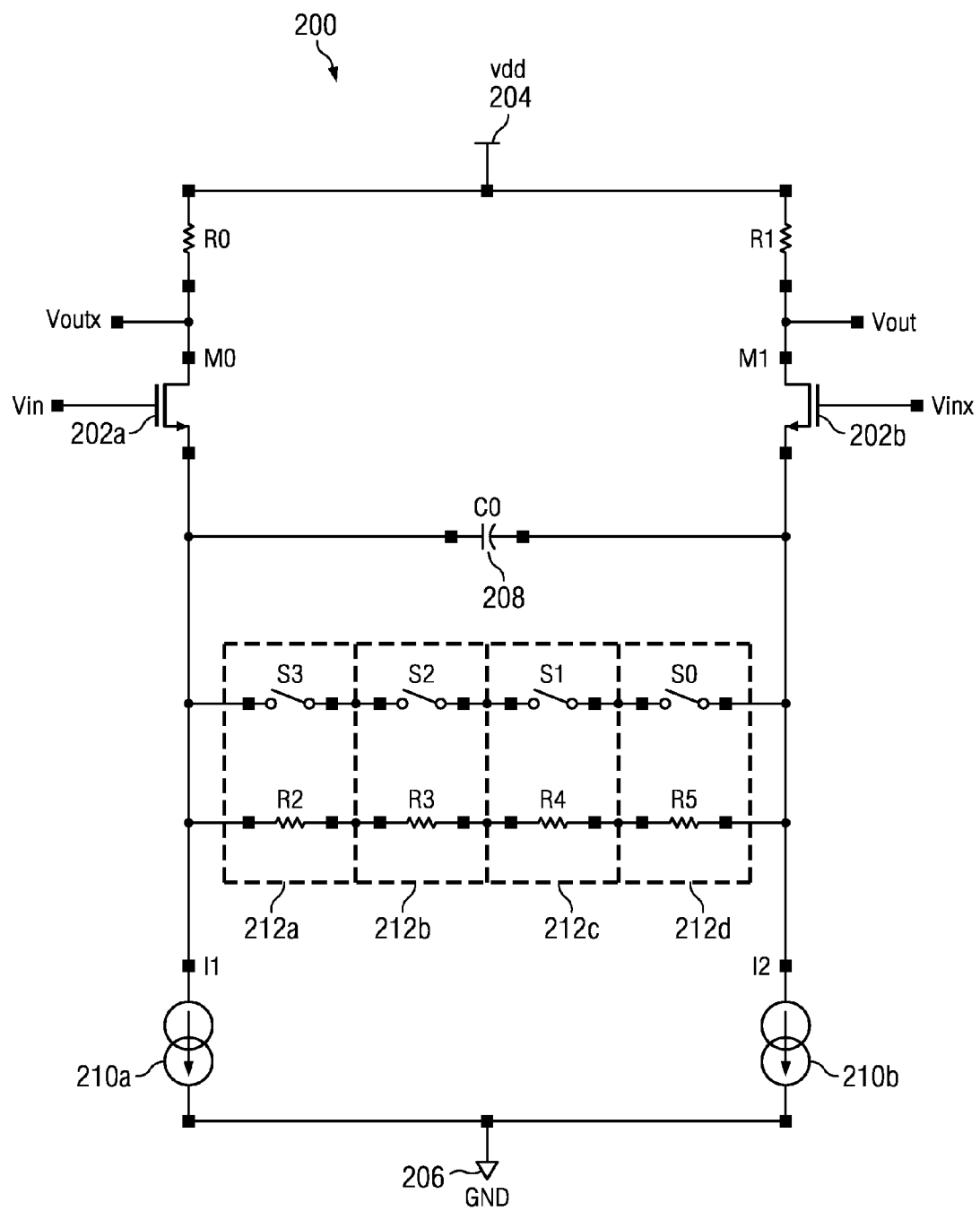
FIG. 2A is a schematic diagram of an amplifier with coarse-fine tuning steps.
Figure 2B:
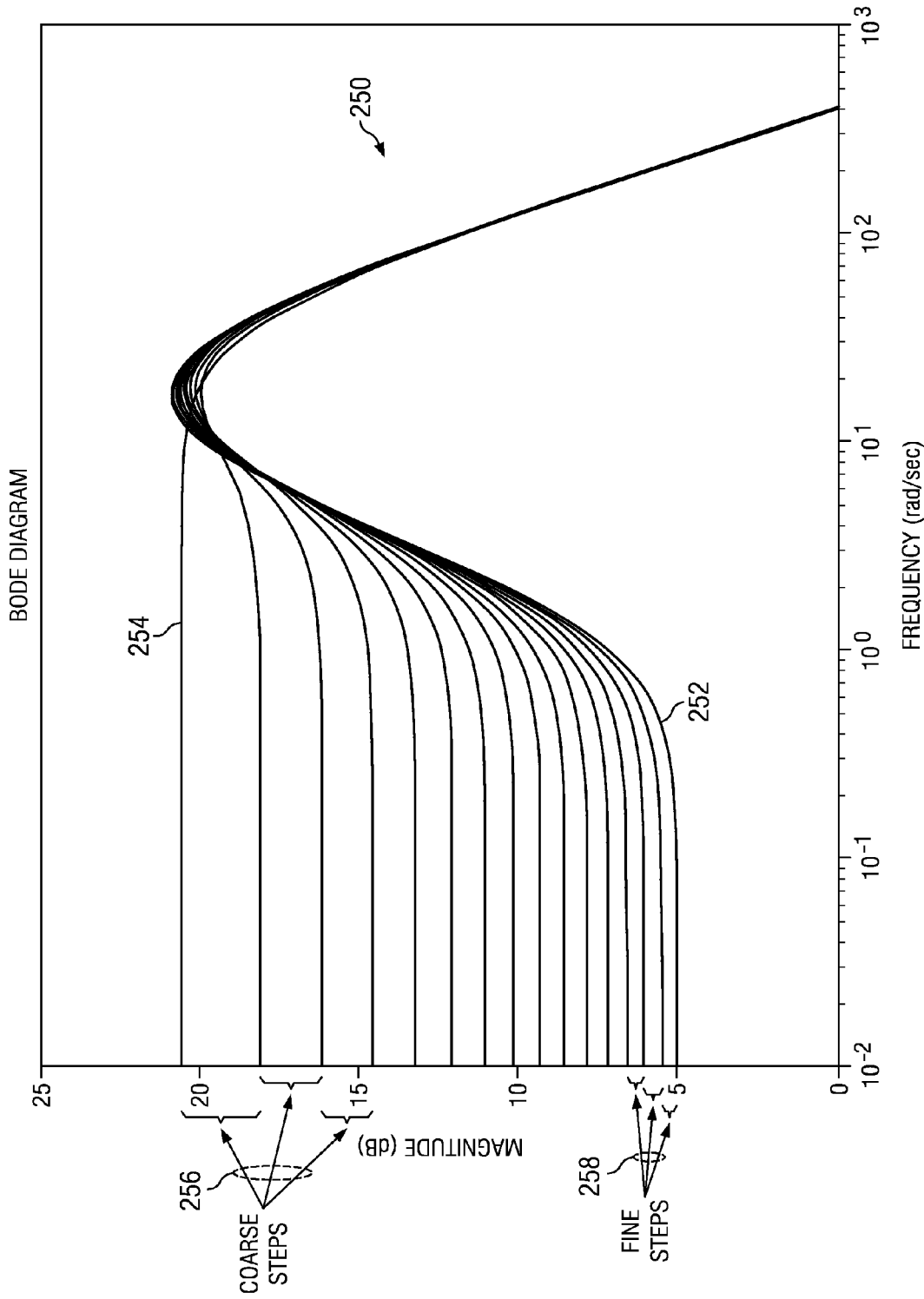
FIG. 2B is a bode diagram of the amplification of the amplifier of FIG. 2A.

While amplifier circuit 100 advantageously provides fine tuning at higher gain levels and coarse tuning at lower gain levels as illustrated by bode graph 150, it may be desirable in certain applications or communication environments to have coarse tuning at higher gain levels and fine tuning at lower gain levels. FIGS. 2A and 2B correspond to an amplifier circuit capable of providing coarse tuning at higher gain levels and fine tuning at lower gain levels.

FIG. 2A illustrates a schematic diagram of an amplifier circuit 200 for amplification with coarse-fine tuning steps. In particular embodiments, the elements of amplifier circuit 200 interoperate to amplify a signal by tuning the gain of the amplifier to provide suitable amplification at appropriate operating frequencies. For example, amplifier circuit 200 facilitates adding or subtracting resistive elements to the amplifier circuit using a collection of tuning stages, each tuning stage having a resistor and a switch connected to each other in parallel and each tuning stage connected in series to the other such tuning stages. Amplifier circuits with variable tuning, such as the one illustrated in amplifier circuit 200, provide users with flexibility to adjust the amplification of the circuit as needed in the field by providing coarse tuning at high magnitudes of gain and fine tuning at low magnitudes of gain.

As illustrated, amplifier circuit 200 includes a pair of MOSFETs 202, a voltage source 204, a ground terminal 206, a capacitor 208, current sources 210, and multiple tuning stages 212. As shown, amplifier circuit 200 is operable to receive an input at the gate of MOSFET 102a and an inversion of the input at the gate of MOSFET 102b, facilitate variable tuning through cascaded tuning stages, and provide an output at the drain of the MOSFET 102b and an inverted output at the drain of MOSFET 102a.

MOSFET 202a and 202b represent any transistor suitable for amplifying electrical or electronic signals. In particular embodiments, MOSFET 202a and 202b may be either NMOS or PMOS MOSFETs, or any suitable combination of the NMOS and PMOS MOSFETs. In the illustrated embodiment, MOSFET 202a and 202b are both NMOS MOSFETs. As shown, MOSFET 202a receives the input ($V_{in}$) of the amplifier circuit and provides an inverted output ($V_{outx}$) while MOSFET 202b receives an inverted input ($V_{inx}$) and provides the output ($V_{out}$) of the circuit. As discussed, the amplification rendered by the pair of MOSFETs 202 can be tuned by actuating the tuning stages 212. Although only two MOSFETs 202 are illustrated, amplifier circuit 200 may have any suitable combination of transistors for providing amplification.

Voltage source 204 represents any suitable voltage source for supplying a constant DC voltage across its terminals to amplifier circuit 200. As shown, voltage source 204 may be coupled to the pair of MOSFETs 202 to provide voltage at the drain of each transistor. In particular embodiments, voltage source 204 may be first coupled to one or more resistive elements which are in turn coupled to the drain of the transistors, as shown in the illustrated embodiment. Voltage source 204 provides the voltage that enables MOSFETs 202 to appropriately amplify an input signal with appropriate gains at particular frequencies as controlled by the tuning stages 212.

Ground 208 represents a reference point in the circuit from which voltages in amplifier circuit 200 are measured. In some instances, ground 208 may be connected to electrical ground (e.g., zero voltage or equivalent). For example, the input voltage ($V_{in}$) received at the gate of MOSFET 102a may be measured with reference to ground 208. Similarly, the output voltage ($V_{out}$) at the drain of MOSFET 102B may be measured with reference to ground 208. In a similar manner, other voltages of amplifier circuit 200 may be measured with reference to ground 208.

Capacitor 220 represents any electronic device capable of storing electric charge. In certain embodiments, capacitor 220 may include two conductors acting as terminals separated by a dielectric material such as an insulator. In the illustrated embodiment, capacitor 220 is coupled to the source of MOSFET 202a and the source of the MOSFET 202b. In addition, capacitor 220 is coupled to the tuning stages 212 in a parallel configuration. In particular embodiments, capacitor 220 may control the frequency characteristic of the amplifier circuit 200.

Current sources 210 represent any suitable current source for supplying a DC current on the path connected to the respective current source. As illustrated, each of two current sources 210 is electrically coupled to the source of MOSFETS 202 and 204, respectively, and ground 208. Each of the two current sources 210 forces the current on the path from the source of the respective transistor (MOSFET 102A or 204) to ground to have a constant DC current value.

Tuning stages 212 represent appropriate circuitry for tuning the amplification of amplifier circuit 200. In particular embodiments, more than one tuning stage may be electrically coupled to each other. For example, tuning stages 212a, 212b, 212c, and 212d may be electrically connected in series. As illustrated, each tuning stage may include a switch and a corresponding resistor connected in parallel for tuning the amplification of amplifier circuit 200. For example, actuating the switch of 212a causes the corresponding resistor of tuning stage 212a to adjust the effective resistance collectively provided by the tuning stages 212, thereby tuning the amplification of amplifier circuit 200. In a similar fashion, the switches corresponding to tuning stages 212b-d may be actuated to adjust the level of amplification provided by amplifier circuit 200. Although only four tunings stages are shown, circuits according to the present disclosure may have any suitable number of tuning stages for tuning the gain of amplifier circuit 200 across the frequency domain.

In operation, amplifier circuit 200 receives an input at the gate of MOSFET 202a and an inverted input at the gate of MOSFET 202b for amplification. In particular embodiments, the input would be the signal received at a transceiver following transmission across a communication medium. In order to compensate for signal degradation across the communication medium, amplifier circuit 200 amplifies the received signal (i.e., input to the circuit) using the pair of MOSFETs 202. The gain provided by these transistors is typically controlled by tuning stages 212. In particular embodiments, actuating the switches of each tuning stage 214 affects the gain of amplifier circuit 200 across the frequency spectrum. Following appropriate tuning, the amplified output is accessible at the drain of MOSFET 202b and an inverted amplified output is accessible at the drain of MOSFET 202a. Given that the illustrated embodiment has four tuning stages—namely, 212a, 212b, 212c, and 212d—and that the corresponding switches for each tuning stage has two possible positions, amplifier circuit 200 allows for sixteen possible combinations of amplification tuning In particular embodiments, each combination may correspond to a discrete level of gain that can be applied to the input of amplifier circuit 200. In other embodiments, the frequency characteristic for one possible combination of amplification tuning may be the same as the frequency characteristic for another possible combination, resulting in fewer total frequency characteristics. While the illustrated circuit permits sixteen combinations of tuning, embodiments according to the present disclosure may facilitate any number of discrete gain levels.

While amplifier circuit 200 is illustrated as including specific components oriented in a particular configuration, it should be understood that various embodiments may operate using any suitable arrangement and collection of components capable of providing functionality such as that described. For example, amplifier circuit 200 may include more than or less than four tuning stages.

FIG. 2B is a bode graph 250 illustrating the amplification of amplifier circuit 200 as tuned by tuning stages 212. As illustrated, the x-axis of bode graph 250 depicts frequency in radians per second on a logarithmic scale. The y-axis depicts the magnitude of the gain of amplifier circuit 200 in decibels. The bode graph 250 shows a particular operating range of amplifier circuit 200 as approximately 5 to 50 radians per second for purposes of illustration. Some embodiments may have an operating range from about 10 MHz to 100 GHz. In certain embodiments, the magnitude may range from −10 dB to +10 dB. The bode graph 250 illustrates the characteristics of the amplifier circuit 200 in various tuning configurations. For example, frequency response 252 corresponds to the state in which all switches of tuning stages 212 are disengaged (as shown in FIG. 2A) while frequency response 254 corresponds to the state in which all the switches of tuning stages 212 are engaged. The frequency responses depicted in between frequency response 252 and frequency response 254 illustrate the result of other possible combinations for tuning the amplification of amplifier circuit 200. In particular embodiments, tuning the gain from one tuning combination to another may involve actuating one or more of the switches corresponding to each of the tuning stages 212. As illustrated, the selection of various possible tuning combinations produces discrete gain levels. Bode graph 250 also illustrates that the tuning of amplifier circuit 200 by tuning stages 212 causes coarse tuning steps 256 at higher gain levels and fine tuning steps 258 at lower gain levels. In particular embodiments, the difference in gain between two adjacent gain levels may be more at higher magnitudes of gain than at lower magnitudes of gain. For example, adjacent gain levels at lower magnitudes of gain may have a difference of less than about one decibel. In those embodiments, adjacent gain levels at higher magnitudes of gain may have a difference of greater than about one decibel. For example, the difference in magnitudes at higher magnitudes of gain may span from about 1 decibels to about 3 decibels as depicted in bode graph 250. Such variations in adjacent gain levels may be achieved by amplifier circuits such as amplifier circuit 200. For example, selecting appropriate values of resistance for the resistor corresponding to each tuning stage 212 along with the serial configuration of tuning stages 212 may render the various gains across the frequency spectrum as illustrated in bode graph 250, thereby facilitating coarse tuning at higher magnitudes of gain and fine tuning at lower magnitudes of gain. In other embodiments, selecting other values of resistance for the resistor corresponding to each tuning stage 212 may render tuning steps that are approximately equal in size.

While system 250 is illustrated as depicting particular gain levels at certain frequencies for a particular circuit, it should be understood that other gain levels across the frequency spectrum are also possible. For example, a bode graph corresponding to a circuit including more or less tuning stages 212 may depict additional or fewer gain levels. In addition, amplifier circuit 200 may be combined with amplifier circuit 100 in a suitable manner to provide any appropriate combination of coarse and fine tuning at various magnitudes of gain across the frequency domain.

Although the present disclosure describes several embodiments, it should be understood that a myriad of changes, substitutions, and alternations can be made without departing from the spirit and scope of the invention as defined by the appended claims.

What is claimed is:

1. An apparatus comprising:
    an amplifier having a plurality of tuning stages operable to set the gain of the amplifier to a plurality of discrete gain levels, each of the plurality of tuning stages comprising a switch electrically coupled in parallel to a corresponding resistor and the switch operable when disengaged to cause the amplifier to set the gain to an adjacent one of the plurality of discrete gain levels, the difference in gain between each adjacent one of the plurality of discrete gain levels being more at higher gain levels than at lower gain levels.

2. The apparatus of claim 1, wherein the plurality of tuning stages are electrically coupled to each other in series.

3. The apparatus of claim 1, wherein the difference in gain between each adjacent one of the plurality of discrete gain levels at higher gain levels is greater than about 1 decibel (dB) in magnitude.

4. The apparatus of claim 1, wherein the difference in gain between each adjacent one of the plurality of discrete gain levels at lower gain levels is less than about 1 decibel (dB) in magnitude.

5. The apparatus of claim 1, wherein the amplifier has an operational range of about 10 MHz to 100 GHz.

6. An apparatus of claim 1, wherein the amplifier comprises an additional plurality of tuning stages operable to set the gain of the amplifier to an additional plurality of discrete gain levels, each of the additional plurality of tuning stages comprising a switch electrically coupled in series to a corresponding resistor and the switch operable when engaged to cause the amplifier to set the gain to an adjacent one of the additional plurality of discrete gain levels, the difference in gain between each adjacent one of the additional plurality of discrete gain levels being less at higher gain levels than at lower gain levels.

7. The apparatus of claim 6, wherein the additional plurality of tuning stages are electrically coupled to each other in parallel.

8. An apparatus comprising:
an amplifier having a plurality of tuning stages operable to set the gain of the amplifier to a plurality of discrete gain levels, the difference in gain between each adjacent one of the plurality of discrete gain levels being more at higher gain levels than at lower gain levels.

9. The apparatus of claim 8, wherein the plurality of tuning stages are electrically coupled to each other in series.

10. The apparatus of claim 8, wherein the difference in gain between each adjacent one of the plurality of discrete gain levels at higher gain levels is greater than about 1 decibel (dB) in magnitude.

11. The apparatus of claim 8, wherein the difference in gain between each adjacent one of the plurality of discrete gain levels at lower gain levels is less than about 1 decibel (dB) in magnitude.

12. The apparatus of claim 8, wherein the amplifier has an operational range of about 10 MHz to 100 GHz.

13. An apparatus of claim 8, wherein the amplifier further comprises an additional plurality of tuning stages operable to set the gain of the amplifier to a plurality of additional discrete gain levels, the difference in gain between each adjacent one of the additional plurality of discrete gain levels being less at higher gain levels than at lower gain levels.

14. The apparatus of claim 13, wherein the additional plurality of tuning stages are electrically coupled to each other in parallel.

15. A method comprising:
receiving an input at an input port of an amplifier;
communicating the received input to a plurality of tuning stages;
amplifying the received input by a gain corresponding to one of a plurality of discrete gain levels that the amplifier is capable of providing, the difference in gain between each adjacent one of the plurality of discrete gain levels being more at higher gain levels than at lower gain levels; and
providing an output at an output port of the amplifier.

16. The method of claim 15, wherein the plurality of tuning stages are electrically coupled to each other in series.

17. The method of claim 15, wherein the difference in gain between each adjacent one of the plurality of discrete gain levels at higher gain levels is greater than about 1 decibel (dB) in magnitude.

18. The method of claim 15, wherein the difference in gain between each adjacent one of the plurality of discrete gain levels at lower gain levels is less than about 1 decibel (dB) in magnitude.

19. The method of claim 15, wherein the amplifier has an operational range of about 10 MHz to 100 GHz.

20. An method of claim 15, wherein the amplifier further comprises an additional plurality of tuning stages operable to set the gain of the amplifier to a plurality of additional discrete gain levels, the difference in gain between each adjacent one of the additional plurality of discrete gain levels being less at higher gain levels than at lower gain levels.

21. The method of claim 20, wherein the additional plurality of tuning stages are electrically coupled to each other in parallel.

22. The method of claim 15, wherein the input is a differential input and the input port includes two differential nodes, and the output is a differential output and the output port includes two nodes.

23. An apparatus comprising:
an amplifier having a plurality of tuning stages operable to set the gain of the amplifier to a plurality of discrete gain levels, each of the plurality of tuning stages comprising a switch electrically coupled in parallel to a corresponding resistor and the switch operable when disengaged to cause the amplifier to set the gain to an adjacent one of the plurality of discrete gain levels, the difference in gain between each adjacent one of the plurality of discrete gain levels being approximately equal to each other.

* * * * *